(12) United States Patent
Hung et al.

(10) Patent No.: US 6,386,213 B1
(45) Date of Patent: May 14, 2002

(54) PLATE-TILTING APPARATUS

(75) Inventors: Sheng-Feng Hung, Taipei; Hua-Jen Tseng, Jubei; Chun-Chieh Lee; Yu-Hua Yeh, both of Hsinchu, all of (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/479,535

(22) Filed: Jan. 7, 2000

(30) Foreign Application Priority Data

Aug. 20, 1999 (TW) .......................................... 88114297

(51) Int. Cl.⁷ ................................................. B08B 3/04
(52) U.S. Cl. ........................ 134/140; 134/164; 134/902
(58) Field of Search ................................. 134/902, 140, 134/159, 160, 164; 118/500; 269/71, 79; 414/403, 416.02, 419, 680, 754, 783; 211/1.57, 174, 209; 108/6, 7; 248/371, 397

(56) References Cited

U.S. PATENT DOCUMENTS

| | | | | |
|---|---|---|---|---|
| 396,923 A | * | 1/1889 | Foreman | 414/680 |
| 2,660,833 A | * | 12/1953 | Weber | 118/500 X |
| 3,712,480 A | * | 1/1973 | Houssa | 4141/783 |
| 4,940,067 A | * | 7/1990 | Beard | 269/79 X |
| 5,622,348 A | * | 4/1997 | Stechly | 248/371 |
| 5,976,255 A | * | 11/1999 | Takaki et al. | 118/500 |
| 6,090,205 A | * | 7/2000 | Sakai et al. | 118/500 |

FOREIGN PATENT DOCUMENTS

| | | | | |
|---|---|---|---|---|
| DE | 286358 | * | 8/1915 | 134/160 |
| JP | 138830 | * | 10/1980 | 118/500 |
| JP | 209822 | * | 9/1991 | 134/902 |
| JP | 37131 | * | 2/1992 | 134/902 |

OTHER PUBLICATIONS

IBM Technical Disclosure Bulletin, vol. 14, No. 12, May 1972, "Wafer Carrier Conveyor" by Wagler et al.*

* cited by examiner

*Primary Examiner*—Philip R. Coe
(74) *Attorney, Agent, or Firm*—Alston & Bird LLP

(57) ABSTRACT

A plate-tilting apparatus adapted to be used in a semiconductor-manufacturing process is disclosed. The plate-tilting apparatus is used for preventing thin wafers from being collected in a cassette contacted with each other after the thin wafers are taken out of a solution. It includes a plate having the container locked thereon and having a first edge pivotally connected to a basal plane of a tank used in the semiconductor-manufacturing process, and a plate-lifting device connected to a second edge of the plate opposite to the first edge for lifting the second edge of the plate, so that the plate can be tilted at a specific angle.

19 Claims, 5 Drawing Sheets

PLATE-TILTING APPARATUS

FIELD OF THE INVENTION

The present invention relates to a plate-tilting apparatus. and especially to a plate-tilting apparatus adapted to be used in a semiconductor-manufacturing process.

BACKGROUND OF THE INVENTION

In the semiconductor-manufacturing process, a wafer needs to be processed through many times of etching and polishing processes. Each of the etching and polishing processes will remove a thin surface layer from the wafer and generate some extraneous or unwanted materials. These contaminants are very harmful to the properties of the semiconductor devices. In order to improve the yield, after every step, wafers need to be cleaned carefully. Nowadays, with the progress of the semiconductor-manufacturing process, not only is the line width of conducting lines in the semiconductor device getting smaller and smaller, but the thickness of wafers is getting thinner and thinner. While the thickness of a wafer is less than 200 $\mu$m. it becomes more and more difficult to clean the wafers effectively.

FIG. 1 schematically shows a wafer cassette 10 generally used in the semiconductor-manufacturing process. There are a plurality of slots 101 on the cassette 10 to collect and separate a plurality of wafers 11 therein. When the wafers 11 are cleaning (the cleaning process is shown in FIG. 2), the whole cassette 10 is immersed in and taken out of from some cleaning solutions, such as pure deionized water, in sequence. Finally, the wafers 11 are carefully dried by spraying isopropyl alcohol (IPA) on the surface of every wafer and evaporating IPA under the presence of hot $N_2$ to complete the cleaning process.

Unfortunately. if the thickness of a wafer is quite thin, especially less than 200 $\mu$m, the wafers 11 collected in the cassette 10 can not be dried completely. As shown in FIG. 3. the wafers 11 will bend naturally because the thickness of the wafers is much smaller than the width of the slots 101. Furthermore, the electrostatic force will cause adjacent wafers 11 to contact with each other while they are taking out of the cleaning solutions. Therefore, if the wafers are not dried completely, it is very hard to dry the wafers by using IPA and hot $N_2$ such that the cleaning process will be in vain.

It is therefore attempted by the applicant to deal with the above situation encountered with the prior art. It is further desirable that this problem can be solved without requiring expensive equipment or complicated procedures such that the semiconductor-manufacturing process can be conveniently carried out and needs significantly less time to further reduce the production cost of the assembled systems.

SUMMARY OF THE INVENTION

An object of the present invention is to provide a novel plate-tilting apparatus adapted to be used in a semiconductor-manufacturing process such that the aforementioned limitations and difficulties encountered in the prior art can be overcome.

Another object of the present invention is to provide a novel plate-tilting apparatus adapted to be used in a semiconductor-manufacturing process such that every wafer can be dried completely even though the thickness of the wafers is less than 200 $\mu$m.

The plate-tilting apparatus of the present invention includes a plate having a first edge pivotally connected to a plane surface, and a plate-lifting device connected to a second edge of the plate opposite to the first edge for lifting the second edge of the plate so that the plate can be tilted at an specific angle.

According to the present invention, the plate-lifting device includes a connecting element having a first end connected to the second edge of the plate, a lifting element connected to a second end of the connecting element for lifting the connecting element so as to tilt the plate.

In accordance with the present invention, the lifting element is a motor with a shaft and the connecting element is connected to an end of the shaft.

According to the present invention, the plate-lifting device further includes a controller for precisely controlling the lifting element to tilt the plate to the specific angle.

Preferably, the controller is an electromagnetic valve.

According to the present invention. the plate further includes a locking member for locking a container thereon. The container is preferably a cassette for collecting a plurality of wafers having a thickness less than 200 $\mu$m therein.

In accordance with the present invention, the specific angle is an acute angle, especially 9°.

According to the present invention. the plane surface is a basal plane of a tank used in a semiconductor-cleaning process, and the semiconductor-cleaning process is a drying process using isopropyl alcohol (IPA)

The present invention may best be understood through the following description with reference to the accompanying drawings, in which:

DETAILED DESCRIPTION OF THE PREFERRED EMBODIMENTS

Figure 1:
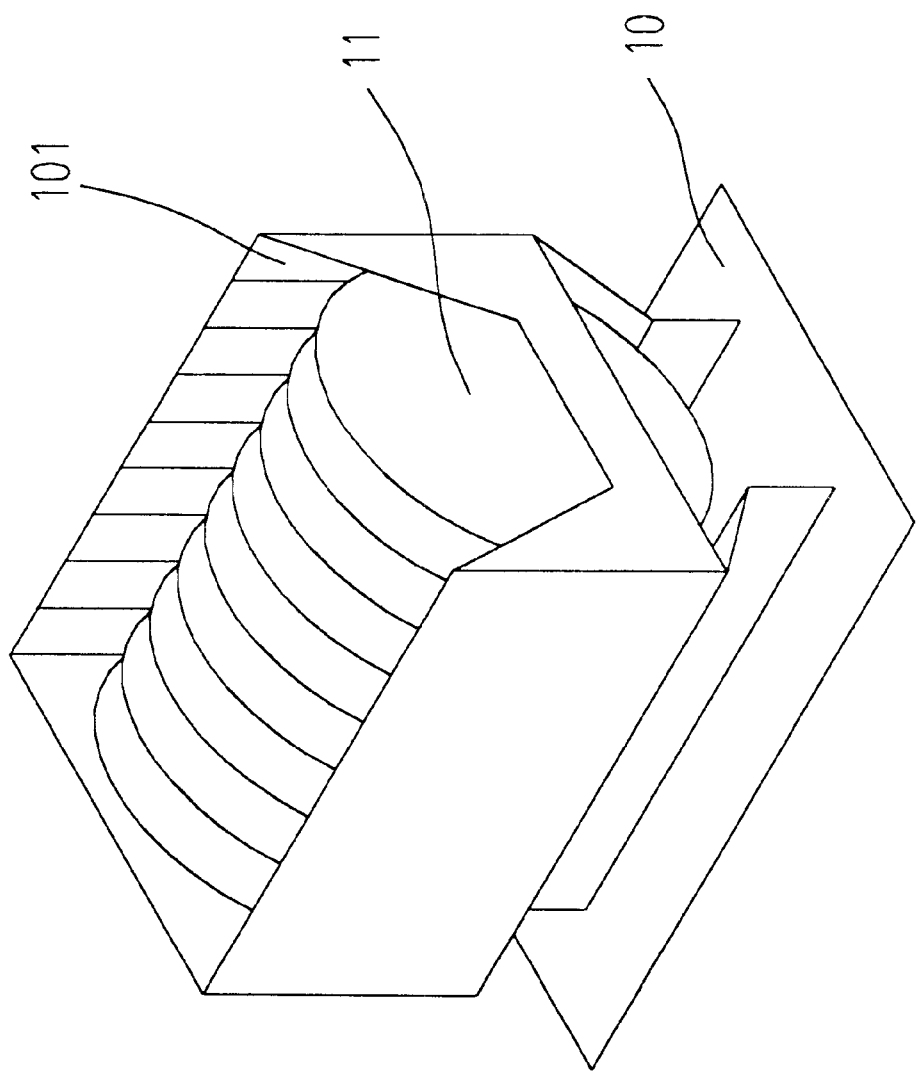
FIG. 1 is a schematic diagram showing a cassette generally used in the semiconductor-manufacturing process.
Figure 2:
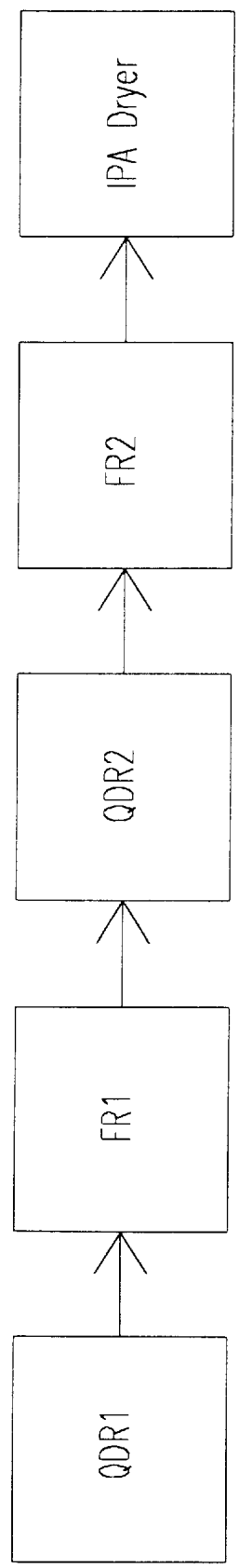
FIG. 2 is a flowchart showing the general cleaning process of the semiconductor-manufacturing process.
Figure 3:
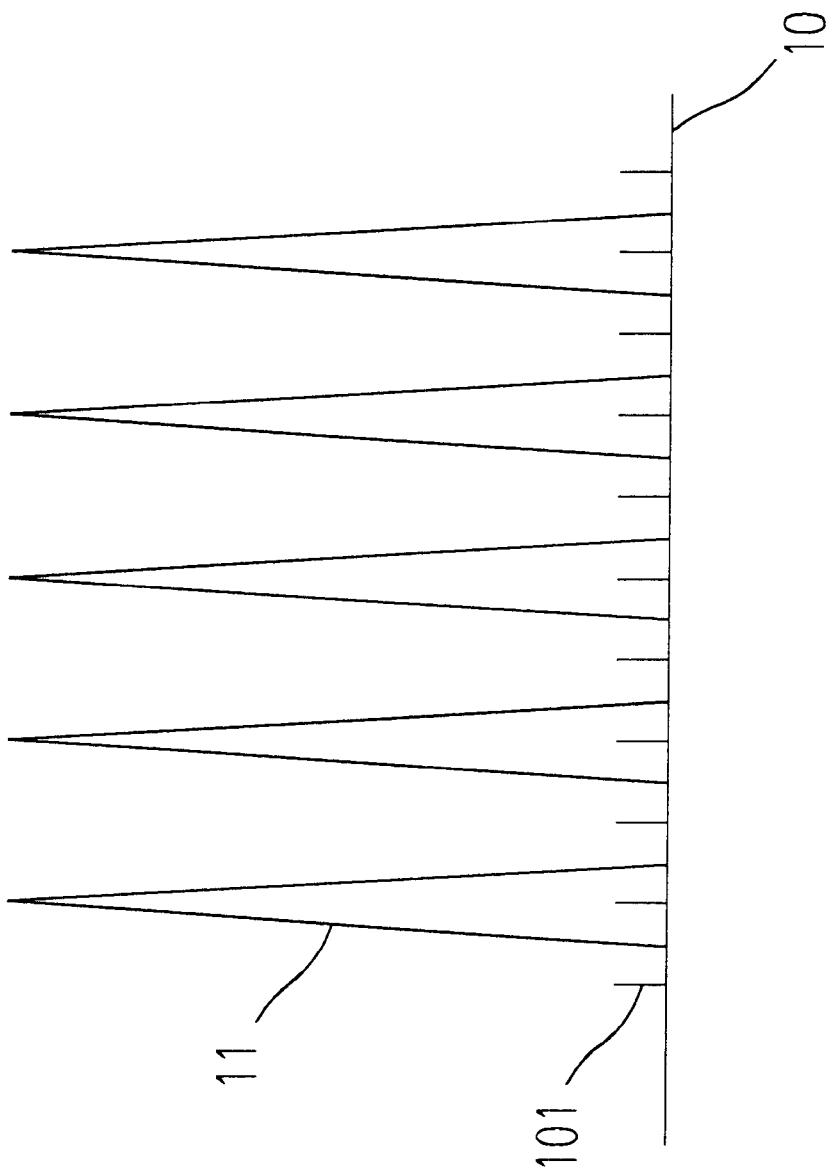
FIG. 3 schematically shows that the adjacent wafers in the cassette contact with each other when the thickness of the wafers is much smaller than the width of the slots.
Figure 4:
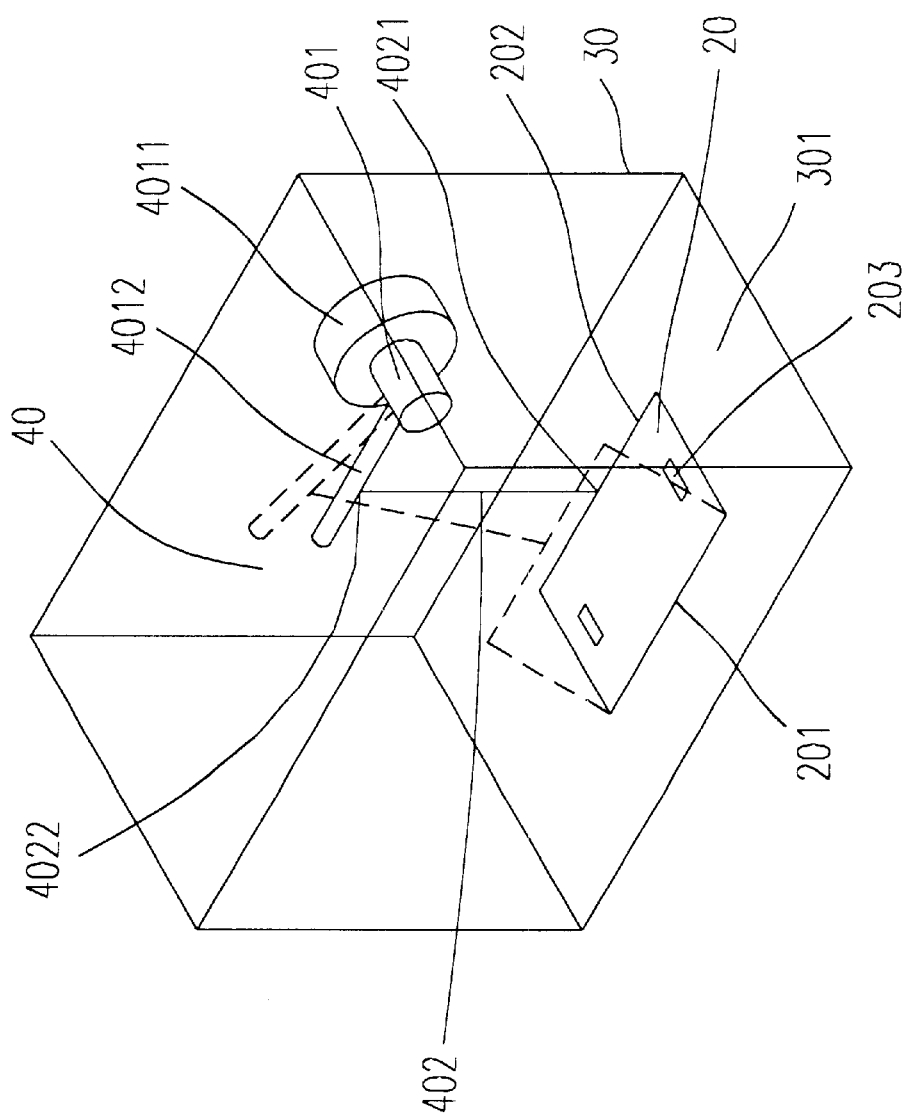
FIG. 4 is a schematic diagram showing the plate-tilting apparatus of the present invention.

The plate-tilting apparatus of the present invention is used in a semiconductor-manufacturing process for preventing thin wafers. preferably less than 200 $\mu$m, collected in a wafer cassette from being contacted with each other. As shown in FIG. 4, the plate-tilting apparatus is additionally set inside a tank 30, such as a cleaning tank or etching tank. used in the semiconductor-manufacturing process. The plate-tilting apparatus includes a plate 20 and a plate-lifting device 40. The plate 20 has a first edge 201 pivotally connected to the basal plane 301 of the tank 30 and a second edge 202 opposite to the first edge 201 connected to the plate-lifting device 40. The second edge 202 is not connected to the basal plane 301 so that the plate 20 can be tilted by using the plate-lifting device 40 to lift the second edge 202. Therefore, by controlling the plate-lifting device 40 to lift the second edge 202 at a specific height. the plate 20 can be tilted at a specific angle. The specific tilting angle is preferably 9°.

The plate-lifting device 40 includes a connecting element 402 and a lifting, element 401. One end 4021 of the connecting element 402 is connected to the second edge 202 and the other end 4022 is connected to the lifting element 401. The lifting element 401 is used for lifting the connecting element 402 to allow the plate 20 to be lifted. Preferably, the connecting element 402 is a string or a stick. and the lifting element 401 is a motor 4011 with a shaft 4012, as shown in FIG. 4. Further, the lifting element 401 of the present invention is preferably connected to a controller (not shown in FIG. 4), such as an electromagnetic valve, for precisely controlling the tilting angle.

Figure 5:
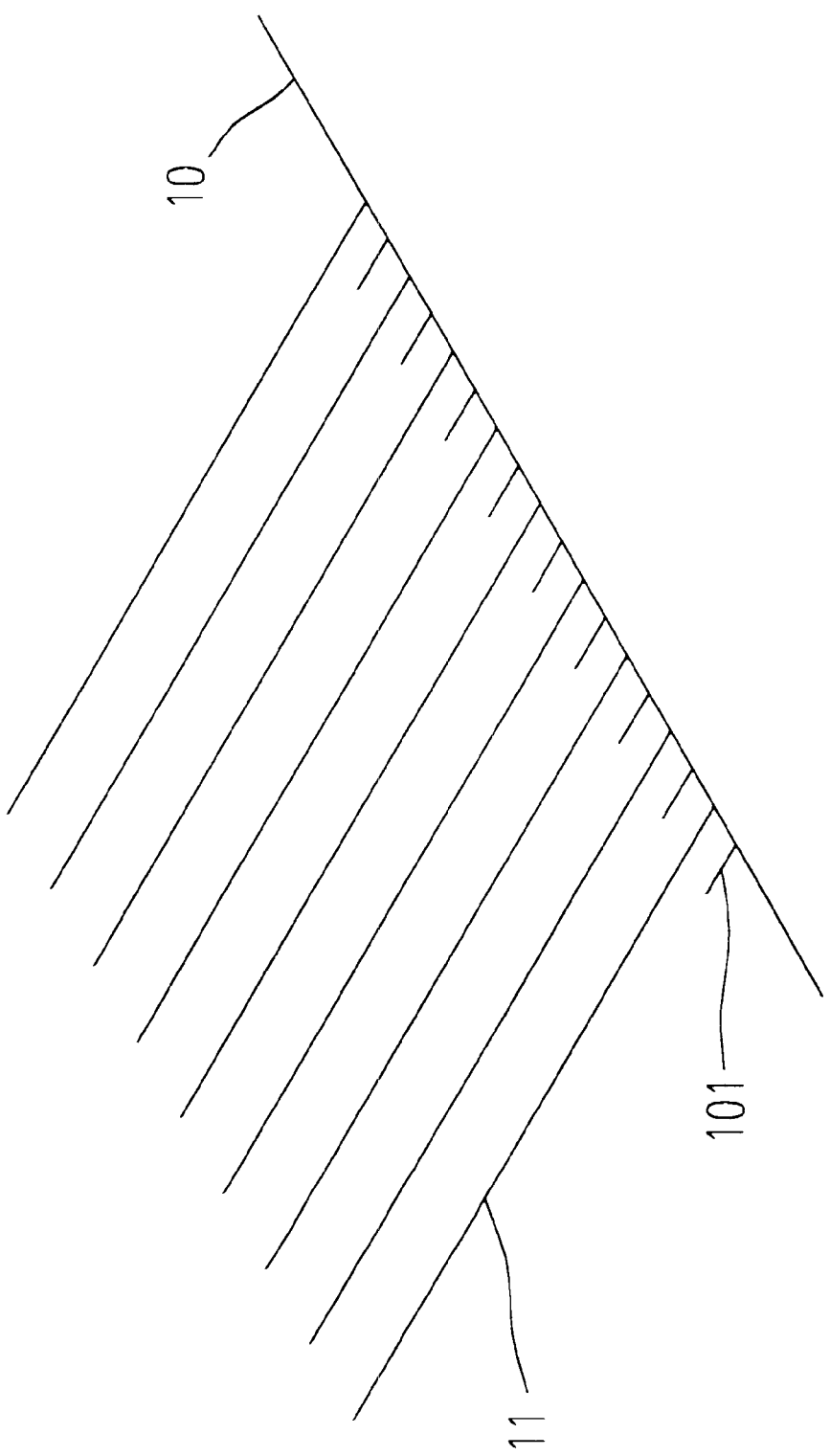
FIG. 5 schematically shows that the wafers in FIG. 3 are separated from each other by using the plate-tilting apparatus of the present invention to tilt the cassette at a specific angle.

The plate 20 further includes a pair of locking members 203 for locking the wafer cassette thereon. There are a plurality of slots 101 on the cassette 10 so that a plurality of thin wafers, preferably less than 200 $\mu$m, can be separately collected therein. The cleaning tank 30 is filled with a cleaning solution for cleaning the wafers. After a few seconds. the cleaning solution will be drained out from the cleaning tank 30. At this moment, the plate-tilting apparatus of the present invention will start to tilt the plate 20 to a specific angle. Therefore, the wafer cassette 10 is tilted at the specific angle, and the thin wafers 11 separately disposed in the wafer cassette 1 are also tilted at the specific angle, as shown in FIG. 5. Because all thin wafers 11 are tilted to the specific angle, neighboring wafers will not contact with each other resulting from the electrostatic force. Therefore, after the cleaning solution is drained out, every wafer can be completely dried dry by using IPA and hot $N_2$.

In conclusion, the plate-tilting apparatus of the present invention an prevent wafers to contact with each other so that the wafers can be dried completely even though the thickness of the wafers are less than 200 $\mu$m.

While the invention has been described in terms of what are presently considered to be the most practical and preferred embodiments. it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A plate-tilting apparatus adapted to be used in a semiconductor-manufacturing process comprising:

a plate having a first edge pivotally connected to a plane surface and a locking member for locking a container thereon; and a plate-lifting device connected to a second edge of said plate opposite to said first edge for lifting said second edge of said plate, so that said plate can be tilted with a specific angle, wherein said container is a cassette for collecting a plurality of wafers therein.

2. The plate-tilting apparatus according to claim 1, wherein said plate-lifting device includes:

a connecting element having a first end connected to said second edge of said plate; and a lifting element connected to a second end of said connecting element for lifting said connecting element so as to tilt said plate.

3. The plate-tilting apparatus according to claim 2, wherein said lifting element is a motor with a shaft and said connecting element is connected to an end of said shaft.

4. The plate-tilting apparatus according to claim 2, wherein said plate-lifting device further includes a controller electrically connected to said lifting element for having said lifting element tilt said plate to said specific angle.

5. The plate-tilting apparatus according to claim 4, wherein said controller is an electro-magnetic valve.

6. The plate-tilting apparatus according to claim 1, wherein said wafers has a thickness less than 200 $\mu$m.

7. The plate-tilting apparatus according to claim 1, wherein said specific angle is an acute angle.

8. The plate-tilting apparatus according to claim 7, wherein said acute angle is 9°.

9. The plate-tilting apparatus according to claim 1, wherein said plane surface is a basal plane of a tank used in said semiconductor-manufacturing process.

10. The plate-tilting apparatus according to claim 9, wherein said tank is a cleaning tank used in a semiconductor-cleaning process of said semiconductor-manufacturing process.

11. The plate-tilting apparatus according to claim 10, wherein semiconductor-cleaning process is a driving process using isopropyl alcohol (IPA).

12. The plate-tilting apparatus adapted to be used in a semiconductor-manufacturing process for preventing thin sheets collected in a container from clinging together after said thin sheets are out of a solution comprising:

a plate having a first edge pivotally connected to a basal plane of said container: and a plate-lifting device connected to a second edge of said plate opposite to said first edge for lifting said second edge of said plate so that said plate can be tilted at a specific angle.

13. The plate-tilting apparatus according to claim 12, wherein said plate-lifting device includes:

a connecting element having a first end connected to said second edge of said plate; and a lifting element connected to a second end of said connecting element for lifting said connecting element so as to tilt said plate.

14. The plate-tilting apparatus according to claim 13, wherein said lifting element is a motor with a shaft and said connecting element is connected to an end of said shaft.

15. The plate-tilting apparatus according to claim 13, wherein said plate-lifting device further includes a controller electrically connected to said lifting element for having said lifting element to tilt said plate to said specific angle.

16. The plate-tilting apparatus according to claim 15, wherein said controller is an electro-magnetic valve.

17. The plate-tilting apparatus according to claim 12, wherein said container is a wafer cassette and said thin sheets are wafers having a thickness less than 200 $\mu$m.

18. The plate-tilting apparatus according to claim 12, wherein said specific angle is 9°.

19. A plate-tilting apparatus adapted to be used in a semiconductor-manufacturing process comprising:

a plate having a first edge pivotally connected to a plane surface; and a plate-lifting device connected to a second edge of said plate opposite to said first edge for lifting said second edge of said plate, so that said plate can be tilted with a specific angle, wherein said plane surface is a basal plane of a tank.

* * * * *